(12) United States Patent
Souchkov et al.

(10) Patent No.: US 8,264,678 B2
(45) Date of Patent: Sep. 11, 2012

(54) LIGHT SENSOR WITH INTENSITY AND DIRECTION DETECTION

(75) Inventors: Vitali Souchkov, Walnut Creek, CA (US); Rob Van Dalen, Bergeijk (NL); Padraig O'Mathuna, San Jose, CA (US)

(73) Assignee: NXP B.V., Eindhoven (NL)

( * ) Notice: Subject to any disclaimer, the term of this patent is extended or adjusted under 35 U.S.C. 154(b) by 133 days.

(21) Appl. No.: 12/811,252

(22) PCT Filed: Dec. 26, 2008

(86) PCT No.: PCT/IB2008/055547
§ 371 (c)(1),
(2), (4) Date: Jul. 1, 2010

(87) PCT Pub. No.: WO2009/087531
PCT Pub. Date: Jul. 16, 2009

(65) Prior Publication Data
US 2010/0283998 A1    Nov. 11, 2010

Related U.S. Application Data

(60) Provisional application No. 61/018,562, filed on Jan. 2, 2008.

(51) Int. Cl.
*G01B 11/26* (2006.01)
*G01J 1/42* (2006.01)

(52) U.S. Cl. .................................. 356/141.2; 356/218

(58) Field of Classification Search ............ 356/141.2, 356/218
See application file for complete search history.

(56) References Cited

U.S. PATENT DOCUMENTS

| | | |
|---|---|---|
| 4,625,108 A | 11/1986 | Nestel et al. |
| 4,682,024 A | 7/1987 | Halldorsson et al. |
| 4,760,436 A | 7/1988 | Yi Zi |
| 4,857,721 A | 8/1989 | Dunavan et al. |
| 5,029,251 A | 7/1991 | Sundberg |
| 6,121,677 A | 9/2000 | Lee |

(Continued)

FOREIGN PATENT DOCUMENTS

DE       3821743 A1      1/1990
(Continued)

OTHER PUBLICATIONS

Using Phase retrieval to measure the intensity and phase of ultrashort pulses: frrequency-resolving optical gating, R Trebino and D Kane, vol. 12, Mo. 5, May 1993, Journal Optical Soc. Am. A. 1993.*

(Continued)

*Primary Examiner* — Isam Alsomiri
*Assistant Examiner* — Antoine J Bedard

(57) ABSTRACT

A light sensor and light sensing system to detect an intensity of incident light and an angle of incidence of the incident light. The light sensor includes a dielectric layer, a plurality of photo detectors coupled relative to the dielectric layer, and a plurality of stacks of opaque slats embedded within the dielectric layer. The dielectric layer is substantially transparent to the incident light. The photo detectors detect the incident light through the dielectric layer. The stacks of opaque slats are approximately parallel to an interface between the dielectric layer and the photo detectors. The stacks of opaque slats define light apertures between adjacent stacks of opaque slats. At least some of the stacks of opaque slats are arranged at a non-zero angle relative to other stacks of the opaque slats.

20 Claims, 10 Drawing Sheets

U.S. PATENT DOCUMENTS

| | | | |
|---|---|---|---|
| 6,875,974 | B2 | 4/2005 | Muesch et al. |
| 2001/0026322 | A1 | 10/2001 | Takahashi et al. |
| 2007/0290284 | A1* | 12/2007 | Shaffer .................. 257/432 |

FOREIGN PATENT DOCUMENTS

| | | | |
|---|---|---|---|
| JP | 08076843 | A | 3/1996 |
| JP | 09243336 | A | 9/1997 |
| JP | 2005249479 | A | 9/2005 |

OTHER PUBLICATIONS

Chen, Erli, et al; "A Novel Device for Detecting the Polarization Direction of Linear Polarized Light Using Integrated Subwavelength Gratings and Photodetectors"; IEEE Photonics Technology Letters, vol. 9, No. 9; 3 Pages (Sep. 1997).

Papalia, Tamara A., et al; "Making Sense of Light Sensors"; Planet Analog; 3 Pages (July 19, 2006).

Born and Wolf; Principles of Optics—Chapter 13 (2009).

International Search Report and Written Opinion for Application PCT/IB2008/055547 (Dec. 26, 2008).

* cited by examiner

LIGHT SENSOR WITH INTENSITY AND DIRECTION DETECTION

This invention relates generally to semiconductor light sensors, or photo detectors, which measure both the intensity and direction of an incident light beam. Stationary and portable electronic displays frequently include functionality to monitor ambient illumination for viewing quality and ergonomic performance. For example, conventional laptop computers, cellular telephones, and other electronic devices include ambient light sensors to determine ambient lighting conditions and adjust the backlight of the device's display screen to a comfortable level within the detected conditions. The orientation of display image planes, as well as appropriate positioning in space of screens and reflectors, also influences the perceived image quality in a variety of applications. In many conventional applications, sensing the intensity of an ambient light, without knowledge of the angular distribution of the ambient light, is not sufficient for adequate control over the display device to compensate for ambient lighting conditions.

In order to measure both the intensity and direction of ambient light, conventional semiconductor light sensors use external components such as collimators or polarizers to determine the direction of the incident light source relative to the light sensor. In some conventional devices, light sensors with external directional components are used for calibration based on the relative position of the reference light source. Collimators, in connection with position sensitive light detectors, are used to collect information on the amount of electric charge induced in one or more electrodes by a collimated light beam. The information from the electrodes is used to derive a direction of incidence of the light. Other conventional devices implement light detectors distributed over a spherical (e.g., hemispherical) surface to determine the direction of incident light based on which light detectors are activated by the incident light. Other conventional devices use polarization filters to uniquely polarize light from different directions to detect the direction of incident light based on the type of polarization detected.

A light sensor and light sensing system are described. Methods of making and using the light sensor and the light sensing system are also described.

In one embodiment, the light sensor detects an intensity of incident light and an angle of incidence of the incident light. An embodiment of the light sensor includes a dielectric layer (or stack of dielectric layers), a plurality of photo detectors coupled relative to the dielectric layer, and a plurality of stacks of opaque slats embedded within the dielectric layer. The dielectric layer is substantially transparent to the incident light. The photo detectors detect the incident light through the dielectric layer. The stacks of opaque slats are approximately parallel to an interface between the dielectric layer and the photo detectors. The stacks of opaque slats define light apertures between adjacent stacks of opaque slats. At least some of the stacks of opaque slats are arranged at a non-zero angle relative to other stacks of the opaque slats. Other embodiments of the light sensor are also described.

An embodiment of the light sensing system includes a light sensor and a light signal processor coupled to the light sensor. The light sensor includes a dielectric layer, a plurality of photo detectors, and a plurality of stacks of opaque slats. The stacks of opaque slats define light apertures between adjacent stacks of opaque slats. The light signal processor receives a photo detector signal from at least one of the photo detectors and computes an intensity of the incident light based on the photo detector signal associated with the incident light detected by the corresponding photo detector. Embodiments of the light signal processor also compute an azimuth angle of the incident light, an angle of incidence of the incident light, and/or other characteristics of the incident light. Other embodiments of the light sensing system are also described. Other aspects and advantages of the present invention will become apparent from the following detailed description, taken in conjunction with the accompanying drawings, illustrating by way of example the principles of the invention.

Throughout the description, similar reference numbers may be used to identify similar elements.

Figure 1:
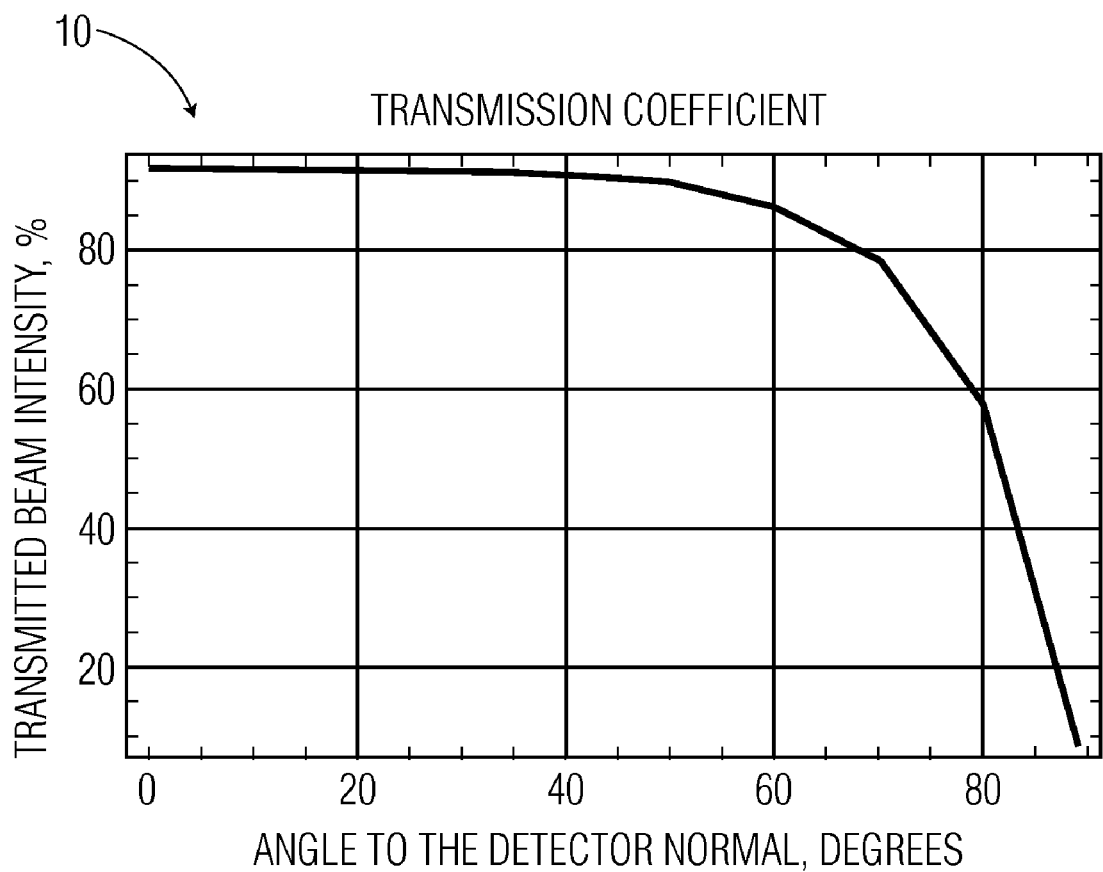
FIG. 1 illustrates a graphical representation of an optical power transmission coefficient for visible light as a function of the angle of incidence for a uniform dielectric with a refraction index of 1.8.

In the following description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

While many embodiments are described herein, at least some of the described embodiments facilitate detection of the intensity and direction of ambient illumination using semiconductor technologies, without external light directing components. Embodiments of the light sensor integrate layers into the photo detector device, allowing determination of both the polar (inclination) and azimuth (bearing) angle of the incident light, along with its intensity. It should be noted that although the description references sensors for detecting light, some embodiments may be capable of detecting electromagnetic radiation outside of the visible light frequency spectrum. Hence, references to the light sensor or sensing light are understood generally as potentially including electromagnetic radiation frequencies outside of the visible light frequency spectrum.

In some embodiments, the directional light sensors are used for control of angular position of electronic displays image planes, mirrors, and screens that allow enhancement of image quality perception at given ambient illumination. Additionally, some embodiments use the detected direction of incident light to control the intensity and the direction for illumination or brightness of an electronic device. Other embodiments use the detected direction of incident light to control light guided equipment.

Embodiments of the light sensor include slats of opaque material (such as metal or polysilicon) embedded in the dielectric (or dielectric layers) of the device. Multiple, successively narrower, horizontally aligned slats are vertically stacked within the dielectric, with the narrowest slat at the top of the stack and the widest slat at the bottom of the stack (closest to the photo detectors and substrate). The stack of slats is vertically aligned (i.e., at a right angle to the surface of the substrate) along one edge, resulting in asymmetrical, wedge-shaped, or tapered, optical barriers. The partial shadowing that the vertically aligned edges of these barriers produce on the underlying photo detector allows determination of the inclination of incident light (with reference to an unimpeded beam, or portion of a beam, that reaches the photo detectors via the asymmetrical aperture between adjacent stacks of slats) which is not aligned along the slits, or apertures, defined between adjacent stacks of opaque slats. Having two such sets of light apertures arranged at a non-zero angle to each other allows determination of both the inclination and azimuth of the incident light. Once the direction of the light is known, the intensity of the light may be determined conventionally, using the transfer function of the dielectric layer.

Thus, embodiments of the light sensor have the capability to detect direction of sensed illumination (radiation flux) in order to obtain information for both: the intensity and the direction of the incident light flux. The opaque layers, or slats, within the semiconductor technological environment are used for modulation of the light (i.e., controlling the fraction of the photo detector area exposed to the incident light beam) as function of the direction of incidence of the light. The opaque slats are made of layers which are positioned inside the transparent dielectric at different heights from photo detectors of the light sensor chip. One or more algorithms may be used to process the signals from the photo detectors in order to allow reconstruction of the angle of inclination and azimuth for the incident light beam, in addition to the measurements of the intensity of the incident light beam. Furthermore, by implementing the light sensor in semiconductor technological environment, the light sensor including the photo detectors and the signal processing electronics may be manufactured in single chip.

While different embodiments of the light sensor and light sensing system may be implemented, at least some embodiments may be implemented with photo detectors that use existing technology such as complimentary metal-oxide semiconductor (CMOS) technology. Additionally, implementations may function without external components such as collimators and polarizers and, hence, facilitate smaller packaging and more efficient use of space. Furthermore, embodiments integrate the sensing of flux and direction into a single package. Other embodiments of the light sensor and light sensing system, as well as corresponding methods, are described in more detail below.

FIG. 1 illustrates a graphical representation 10 of an optical power transmission coefficient for visible light as a function of the angle of incidence for a uniform dielectric with a refraction index of 1.8. In one embodiment, a parallel beam of light is incident at a light sensor surface that is made of a dielectric transparent to the light. The dielectric may be a non-conductive medium with a refraction index of 1.8, although other embodiments may use dielectric layers with different indices of refraction. The oblique incidence propagation direction of refracted light is defined by Snell's law:

$$n_{air} \sin[\theta_I] = n \sin[\theta] \quad (1)$$

where the refraction indices of air and the dielectric layer are designated as $n_{air}$ and $n_s$ respectively, and the angles of the incident and refracted light beams, with respect to the normal to the surface of incidence, are designated as $\theta_I$, and $\theta$, respectively. If light is coming from air, then the calculated (combined for both polarizations) transmitted power is shown in FIG. 1, as a function of the angle of incidence. Therefore, the incident radiation intensity may be recovered from the radiation intensity, of the light that propagates inside the dielectric layer, together with the angle of incidence, provided the angle of the light beam incident at the photo detector positioned beneath the dielectric layer is measured.

Figure 2:
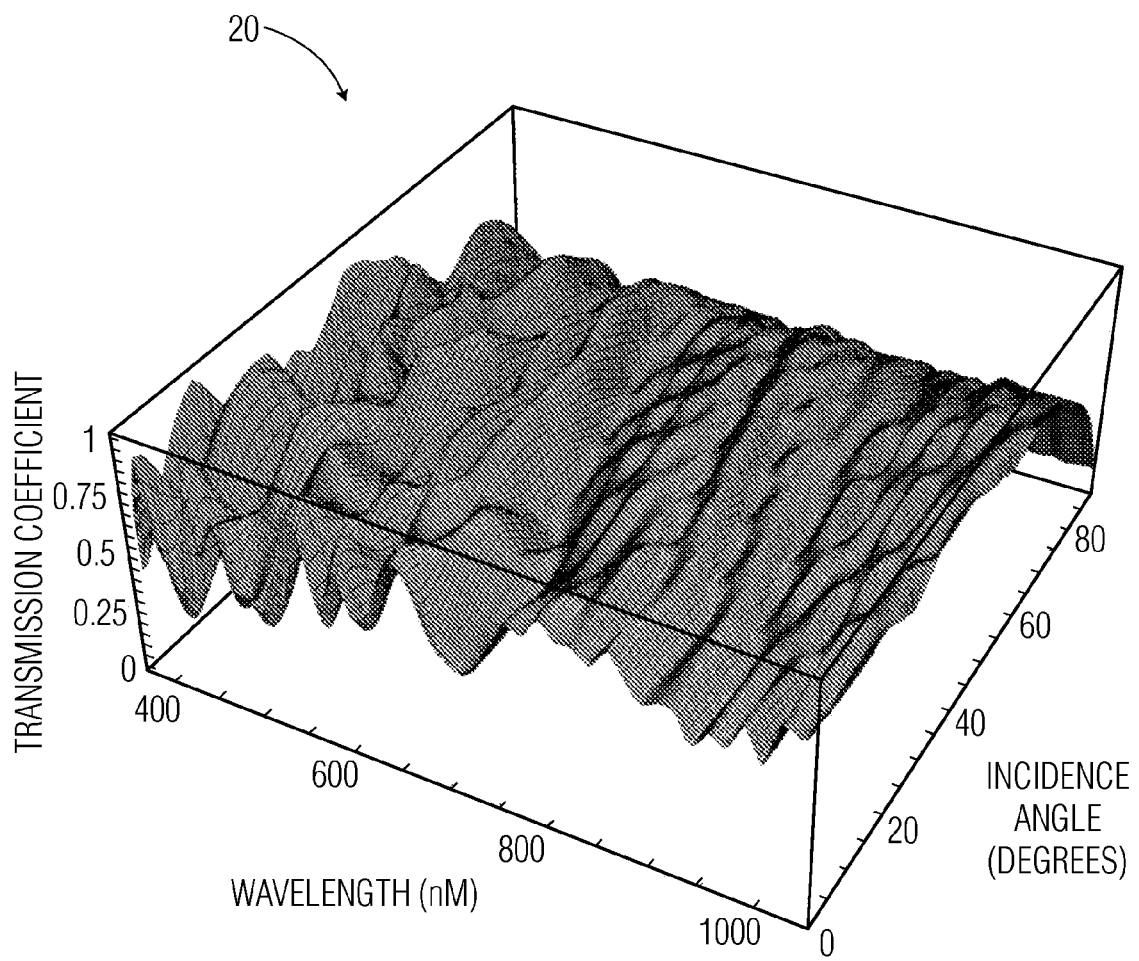
FIG. 2 illustrates a three-dimensional graphical representation of an optical power transmission coefficient for a light beam, with a wavelength range of 350 nM to 1100 nM in air, as a function of the angle of incidence and the wavelength for a dielectric stack corresponding of five metals for standard CMOS technology.

FIG. 2 illustrates a three-dimensional graphical representation 20 of an optical power transmission coefficient for an optical beam, with a wavelength range of 350 nM to 1100 nM in air, as a function of the angle of incidence and the wavelength for a dielectric stack of five metals using CMOS technology. In some embodiments, a stack of dielectrics is used in semiconductor technology that is a technological environment in order to facilitate metal interconnections. The optical power transfer coefficient of a dielectric stack may substantially depend on the wavelength due to Fabry-Perot like resonance conditions occurring for certain wavelengths at different incidence angles. Hence, FIG. 2 provides a visual depiction of the angular dependence of the optical power transfer coefficient as a function of the incidence angle, as well as the wavelength of the incident light, in an exemplary dielectric stack.

Figure 3:
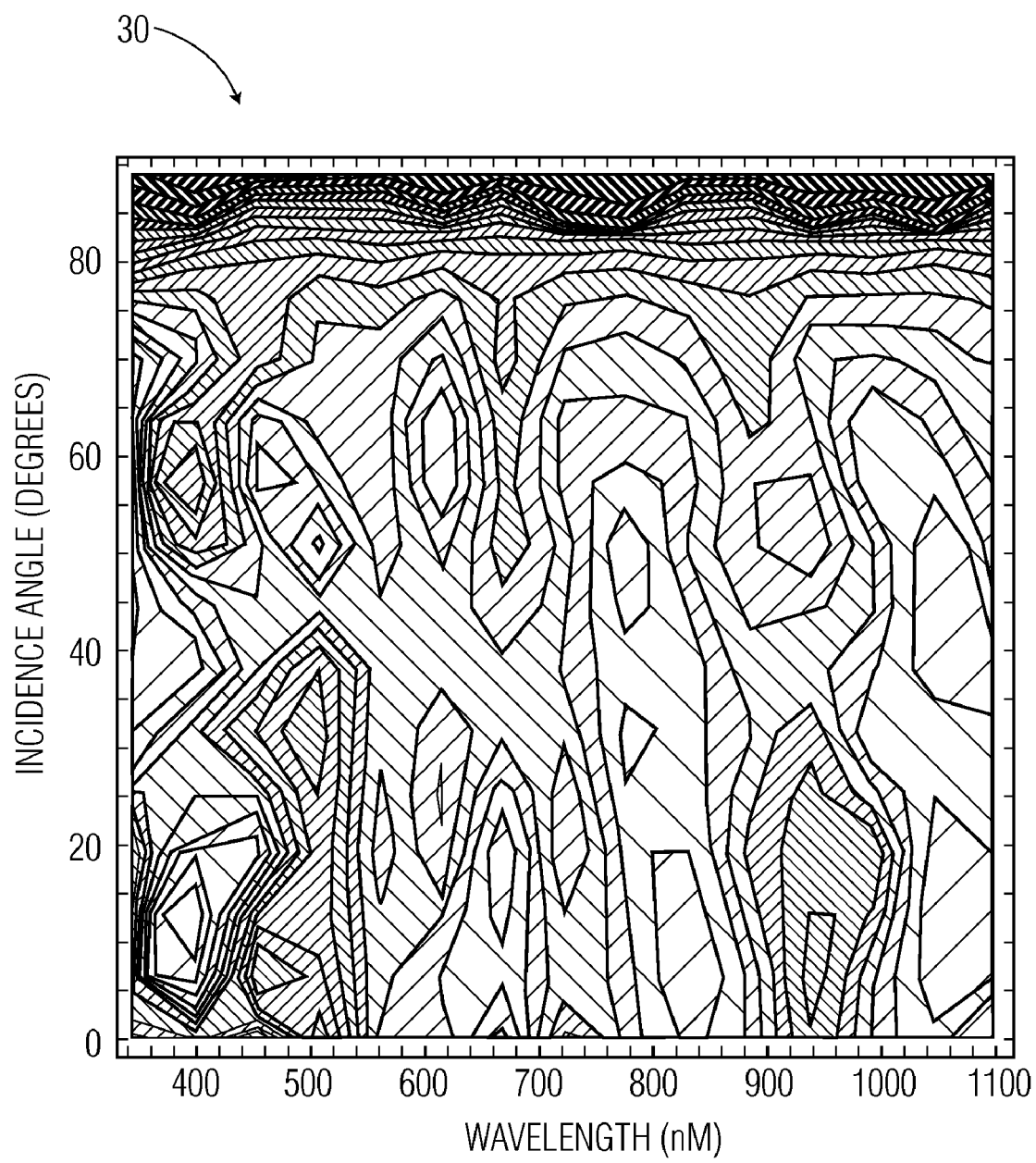
FIG. 3 illustrates a graphical contour plot of the optical power transmission coefficient for the light beam and dielectric stack described in conjunction with FIG. 2.

FIG. 3 illustrates a graphical contour plot 30 of the optical power transmission coefficient for the light beam and dielectric stack described in conjunction with FIG. 2. In one embodiment, the dielectric stack is almost non-transparent for all spectral region of interest at an incidence angle of 85 degrees. However, some "islands" of relatively higher transparency are seen at different angles and particular wavelengths. For a spectrum of the incident radiation described by function $F_I(\lambda)$, the transferred flux, F, may be calculated as follows:

$$F(\theta_I) = \int_{\lambda_{min}}^{\lambda_{max}} F_I(\lambda) T(\lambda, \theta_I) d\lambda \quad (2)$$

where λ is the wavelength of the incident light. For any given spectrum of the incident light, the propagated light intensity is the function of the angle of incidence, $\theta_I$. The propagated light intensity may be also represented as a function of the angle, θ, using expression 1 (and neglecting the inconsequential dependence of the refractive index on the wavelength). If desired, the function of angular transformation (expression 1) may be represented more accurately if the dependence of the refractive index on the wavelength is introduced; for a desired degree of accuracy, the angle, θ, is an unambiguous function of the angle of incidence, $\theta_I$, for any dielectric composition. For the sake simplicity, however, the incident light spectrum is assumed to be described by the spectrum of visible light (i.e., the spectrum having the shape given by a typical eye responsivity curve for pure visible light).

Figure 4A:
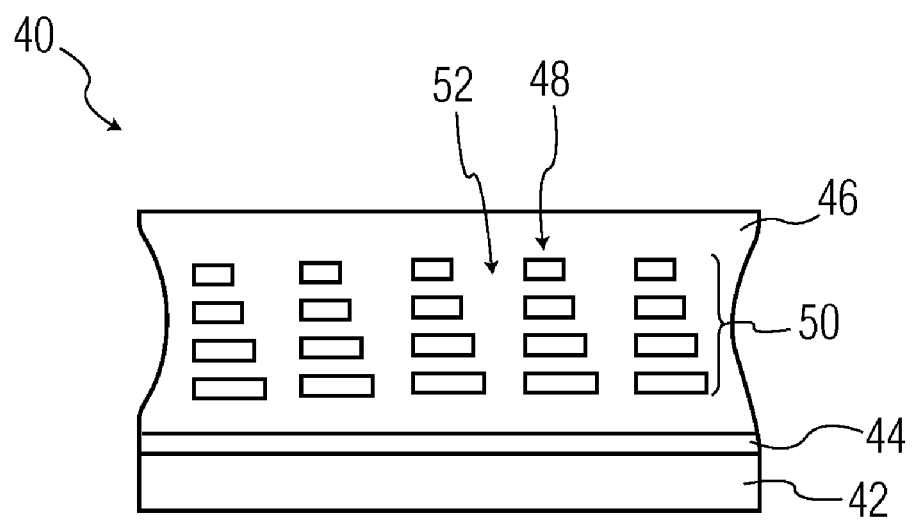
FIG. 4A illustrates a cross-sectional view of one embodiment of an optical detector within a light sensor.

FIG. 4A illustrates a cross-sectional view of one embodiment of an optical detector 40 within a light sensor. In general, the optical detector 40 detects the intensity and direction of light that is incident on the optical detector 40. The depicted optical detector 40 includes a substrate 42. The optical detector 40 also includes one or more photo detectors 44 (e.g., photodiodes) and a dielectric layer 46. The photo detectors 44 are coupled relative to the dielectric layer 46, for example, either in direct physical contact through an intermediate physical material. The photo detectors 44 detect the incident light through the dielectric layer 46. The dielectric layer 46 is substantially transparent to the incident light.

Additionally, the optical detector 40 also includes several stacks 48 of opaque slats 50 which are embedded within the dielectric layer 46. The opaque slats 50 may be made of any opaque material, depending on the fabrication process of the optical detector 40. Some exemplary materials for the opaque slats 50 include metal and poly-silicide. The stacks 48 of opaque slats 50 are oriented horizontally, approximately parallel to the interface between the dielectric layer 46 and the photo detectors 44. In one embodiment, the opaque slats 50 have a length dimension (in plan view) that is substantially greater than width dimension. The specific dimensions of the slats may vary, depending on the implementation of the photo detectors and the dielectric layer. As one example, slats formed in four metal layers could have widths of 3340 nM, 2490 nM, 1680 nM, and 640 nM (from the widest slat at the bottom of the stack to the narrowest slat at the top of the stack). An exemplary width between the bottom slats, in this example, is 2700 nM. In another exemplary embodiment, four metal layers may have widths of 3660 nM, 2810 nM, 2000 nM, and 960 nM, also with a gap of 2700 nM. Other embodiments may use different widths and/or width ratios for the slats (or another number of slats). Additionally, the width between slats at the bottom of adjacent stacks may be another width other than 2700 nM. In these examples, the length may be tens or hundreds of micrometers. In at least some embodiments, the ratio of length to width is approximately 100.

Hence, the opaque slats 50 are similar in configuration to planks of wood or a ruler, although of a size that is appropriate for semiconductor fabrication. The stacks 48 of opaque slats 50 are arranged to define light apertures 52 between adjacent stacks 48 of opaque slats 50. Given the layered nature of the opaque slats 50 to form the stacks 48, the light apertures 52 also may be referred to as multi-layer apertures, which are positioned at different depths from the photo detectors 44. With reference to FIG. 4A, five stacks 48 of opaque slats 50 (shown in cross-sectional view, with four opaque slats 50 per stack 48) define four intermediate light apertures 52.

In at least some embodiments, the opaque slats 50 within a stack 48 have different cross-sectional widths. As shown in FIG. 4A, the four opaque slats 50 in each stack 48 vary in width from the widest (at the bottom of the stack 48) to the narrowest (at the top of the stack 48). Although the opaque slats 50 in the stacks 48 are shown in the order of decreasing width, other embodiments may use other combinations of widths and, additionally, may arrange the opaque slats 50 in an another order.

In the illustrated embodiment, the opaque slats 50 are arranged to form a tapered stack 48 that is widest near the photo detectors 44 and narrowest near the incidence surface of the dielectric layer 46. Alternatively, other taper styles may be implemented with one or more stacks 48. For example, an embodiment may implement a stack 48 with a taper that is narrowest at the bottom and widest at the top. Another exemplary embodiment may implement a substantially non-linear taper, in which the edges of the individual slats 50 align with a non-linear curve or path.

Additionally, the opaque slats 50 shown in FIG. 4A are arranged to define a tapered stack 48 with an asymmetrical cross-section. In particular, the edges on one side of the slats 50 are aligned approximately with the normal (i.e., perpendicular) direction to the substrate 42. However, the edges on the other side of the slats 50 are aligned at a non-zero angle relative to the normal direction to the substrate 42. As one example, the non-zero angle may be approximately 33 degrees for a refractive index of 1.8, although other embodiments may use other non-zero angles. Other embodiments may implement asymmetrically tapered stacks 48 in which both sides of the slats 50 are at non-zero angles relative to the normal direction to the substrate 42.

In one embodiment, the light apertures 52 defined by the stacks 48 of opaque slats 50 are aligned with one or more photo detectors 44. Although various types of photo detectors 44 may be implemented, at least one embodiment implements segmented photo detectors. In some embodiments, the photo detectors 44 may be spectrometer photo detectors. Other embodiments may use other types of photo detectors.

Figure 4B:
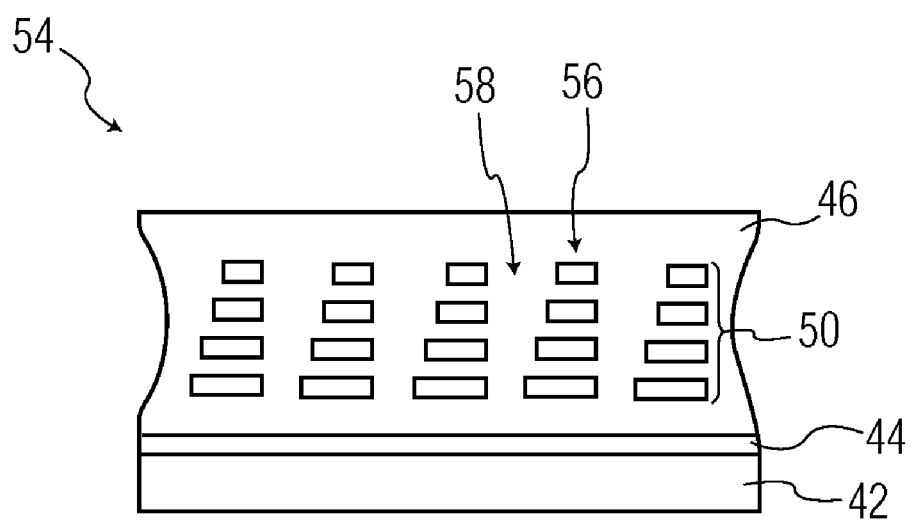
FIG. 4B illustrates a cross-sectional view of one embodiment of another optical detector within a light sensor.

FIG. 4B illustrates a cross-sectional view of one embodiment of another optical detector 54 within a light sensor. The component parts of the optical detector 54 are substantially similar to the optical detector 40. However, the stacks 56 of opaque slats 50 are arranged define light apertures 58 that are essentially the mirror image (i.e., reverse image) of the light apertures 52 of the optical detector 40 (i.e., with the tapered edge on the other side of the stacks 56).

Figure 5A:
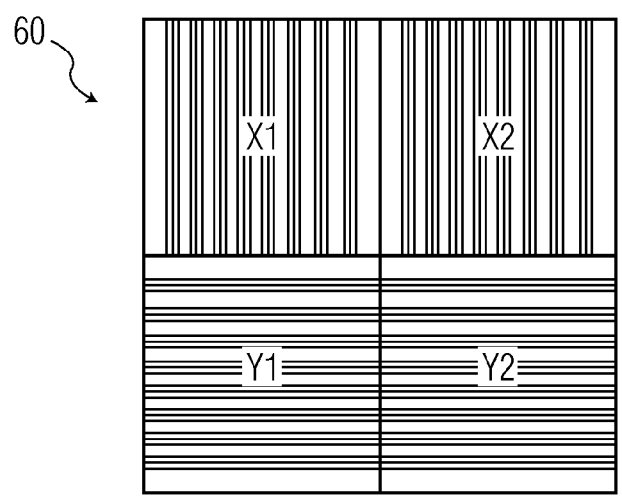
FIGS. 5A-5D illustrate various arrangements of optical detectors for a directional light sensor.
Figure 5B:
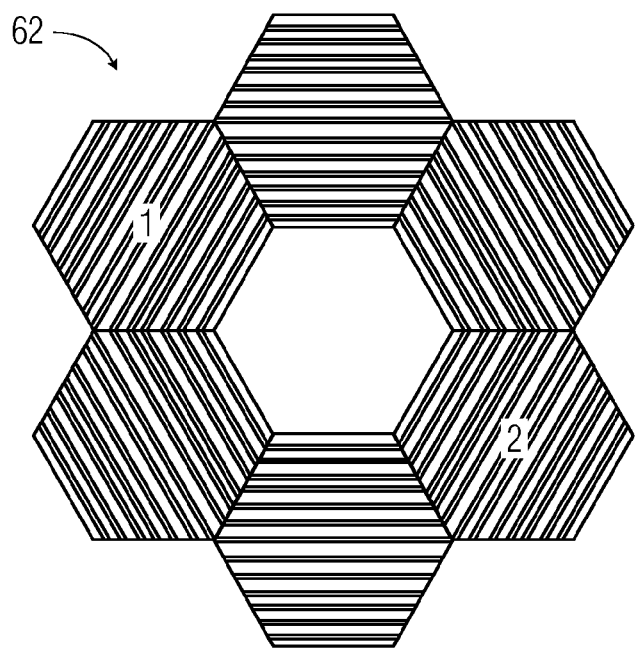
Figure 5C:
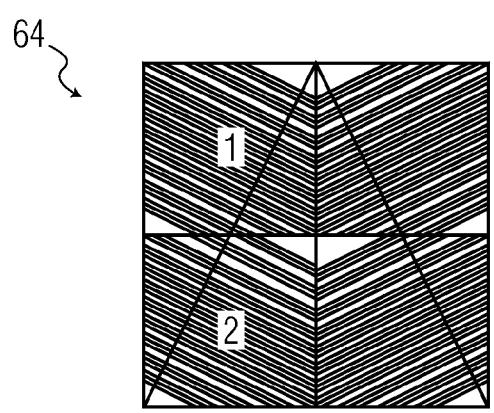
Figure 5D:
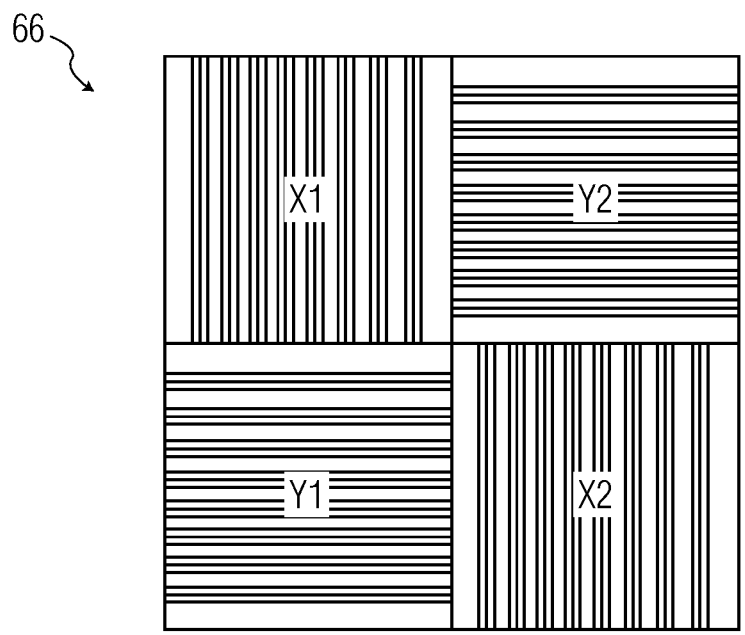

FIGS. 5A-5D illustrate various arrangements of optical detectors for a directional light sensor. Since it is useful to detect the In particular, FIG. 5A shows an optical detector 60 with two pairs (the first pair with X1 and X2; and the second pair with Y1 and Y2) of photo detectors 44 with corresponding stacks 48 of opaque slats 50 (shown in plan view as vertical and horizontal lines). Each pair of photo detectors 44 includes parallel stacks 48 of opaque slats 50. However, the stacks 48 of opaque slats 50 in each pair are oppositely configured, similar to the implementations shown in FIGS. 4A and 4B. For example, the opaque slats 50 corresponding to the photo detector 44 designated as X1 is asymmetric in one direction, as shown in FIG. 4A, while the opaque slats 50 corresponding to the photo detector 44 designated as X2 is asymmetric in the opposite direction. Similarly, the opaque slats 50 corresponding to the photo detectors 44 designated as Y1 and Y2 are parallel, but use opposite asymmetrical stacks.

It should also be noted that using multiple pairs of photo detectors 44 may facilitate detecting a direction, in addition to the intensity, of the light beam incident on the light sensor, as long as there are two or more pair with non-parallel (e.g., orthogonal) light apertures 52. For example, the first pair of photo detectors 44 (X1 and X2) have parallel light apertures 52 that are orthogonal to the light apertures 52 of the second pair of photo detectors 44 (Y1 and Y2). Other embodiments may use non-parallel light apertures 52 that are not orthogonal, or a combination of orthogonal and non-orthogonal light apertures 52. For example, FIG. 5B uses an arrangement 62 of three pairs of hexagonal photo detectors 44 with one exemplary pair designated by 1 and 2. As another example, FIG. 5C uses an arrangement 64 of two pairs of rectangular photo detectors 44 with an exemplary pair also designated by 1 and 2. As another example, FIG. 5D uses an arrangement 66 which is similar to FIG. 5A, except that the locations of the pairs of photo detector segments are relocated. For each pair of photo detectors 44, or photo detector segments, the cross-sections of the light apertures 52 are profiled as shown in FIG. 4, and described above. In particular each pair of photo detectors 44, or photo detector segments, uses parallel light apertures 52 with mirrored, or reversed, wedge shapes. In each of these embodiments, at least some of the stacks 48 of opaque slats 50 are arranged at a non-zero angle relative to other stacks 48 of the opaque slats 50. Additionally, the photo detectors 44 are configured to detect light incident along a path that is not parallel to the length of the corresponding light apertures 52.

Figure 6:
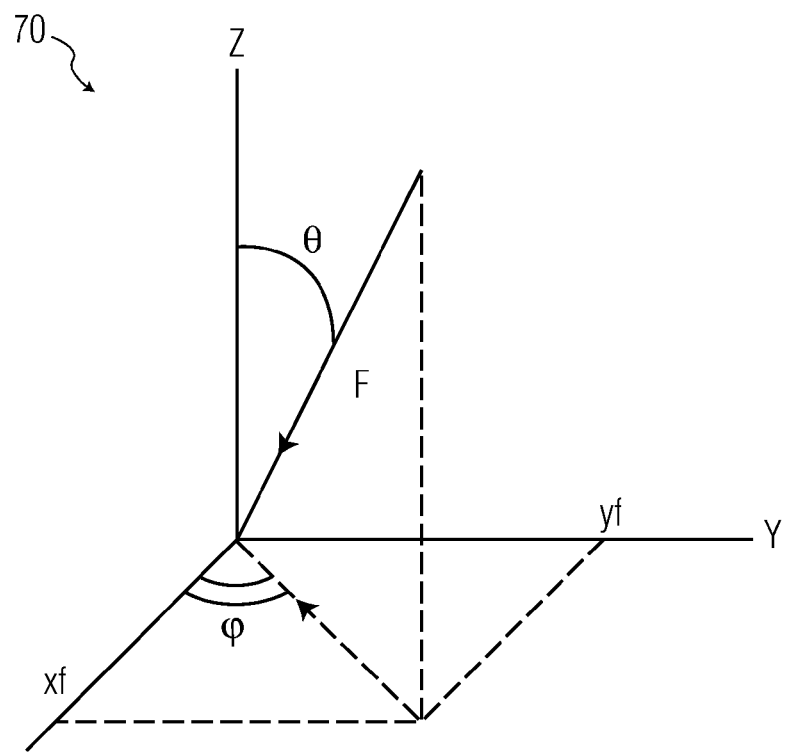
FIG. 6 illustrates a graphical representation of a photon flux density vector, F, which intersects a plane, the XY plane, of a photo detector.

FIG. 6 illustrates a graphical representation 70 of a photon flux density vector, F, which intersects a plane, the XY plane, of a photo detector 44. In this graphical representation 70, the azimuth angle is designated as φ, and the incidence angle to the detector plane normal is designated as θ.

For the complete representation of vector F, at least two projections of vector F on sensing directions are detected, as illustrated for the X and Y directions in FIG. 6. Other embodiments may use more than two sensing directions (e.g., with more than two pairs of segments with light apertures 52, or slits, that correspond to these directions), which may allow for detection of the divergent flux profiles.

Figure 7:
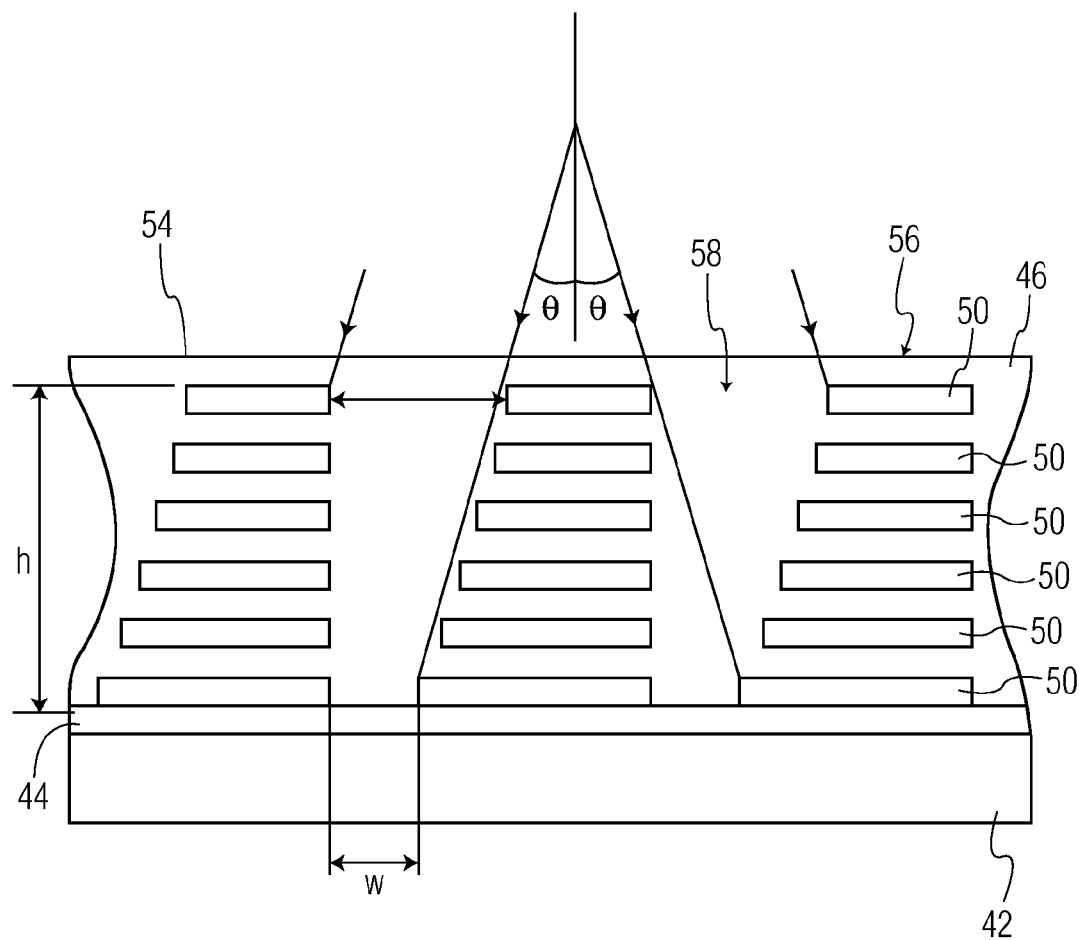
FIG. 7 illustrates geometrical parameters of the optical detector of FIG. 4B.

FIG. 7 illustrates geometrical parameters of the optical detector 54 of FIG. 4B. The multi-layer apertures 58 vary in width at different depths from the front surface of the optical detector (e.g., the chip front surface). It should also be noted that the stacks 56 of opaque slats 50 allow effective shadowing of the photo detectors 44 in certain positions, depending on the angle of incidence of the incident light beam. In other words, the optical detector 54 includes at least one stack 56 of opaque slats 50 that blocks incident light at an angle of incidence from reaching a photo detector 44 adjacent to the corresponding stack 54 of opaque slats 50. For light that reaches the photo detectors 44, the photo detectors generate one or more corresponding electrical signals, or photocurrents.

After transformation by the dielectric stack 46, a parallel beam of light is incident on a photo detector 44 at an angle of θ relative to the photo detector plane normal. The opaque slats 50 located in the dielectric layer 46 present an orthogonal, or otherwise non-parallel, system of light apertures 58 in the X and Y directions, as described above. The photocurrents produced in the photo detectors 44 sensing in X and Y directions may be expressed as follows:

$$I_{1x} = Lw \cos[\theta] F/\theta/\eta \tag{3a}$$

$$I_{2x} = L(w - hTg[\theta] \cos[\phi]) \cos[\theta] F/\theta/\eta \tag{3b}$$

$$I_{1y} = Lw \cos[\theta] F/\theta/\eta \tag{4a}$$

$$I_{2y} = L(w - hTg[\theta] \sin[\phi]) \cos[\theta] F/\theta/\eta \tag{4b}$$

where L is total length of the openings in the aperture placed in front of each photo-detector, F[θ] represents the photon flux power density (a function of the incidence angle), η represents the photo detector integrated quantum efficiency for the spectral region in consideration, φ is the azimuth of direction of incidence at the detector plane, and Tg represents a tangent function. In some embodiments, the height, h, of the stacks 56 and the width, w, of the light apertures 58 are specified to allow light with a maximal angle of incidence, $\theta_{max}$, to be detected. The maximal angle, $\theta_{max}$, is determined by the same condition that defines the total internal reflection in a uniform dielectric.

$$\sin[\theta_{max}] = \frac{1}{n} \tag{5}$$

The sensor design shown in FIG. 7 assumes that:

$$Tg[\theta_{max}] = \frac{w}{h} \tag{6}$$

From the equations above, the azimuth angle, φ, is found from the four detected signals, as follows:

$$\varphi = \text{Arc}Tg\left[\frac{I_{1y} - I_{2y}}{I_{1x} - I_{2x}}\right] \tag{7}$$

The geometrical parameters L, w, and h and the expressions 3a, 3b, 4a, 4b above may be used to derive the angle of incidence, θ, as follows:

$$\theta = \text{Arc}Tg\left[\frac{w}{h}\left(1 - \frac{I_{2x}}{I_{1x}}\right)\frac{1}{\cos[\varphi]}\right] = \text{Arc}Tg\left[\left(1 - \frac{I_{2x}}{I_{1x}}\right)\frac{Tg[\theta_{max}]}{\cos[\varphi]}\right] \tag{8}$$

Additionally, the integrated flux, F, may be found using expressions 3a or 4a. The angle of incidence in the air, $\theta_r$, is derived from the angle of incidence in dielectric, θ, via Snell's law (or applying Snell's law in sequence to multiple dielectric layers in a dielectric stack). Using the optical power transfer function of the dielectric stack, the light intensity in the air may be recovered through the dependence described in expression 2. This could be done for any given shape of spectrum of the light source (e.g., for pure visible light, using the shape given by a typical eye responsivity curve). By using a signal processor that allows extraction of the visible radiation component from the photo detector signal, the incident luminous radiation flux may be fully recovered using the proposed principle.

Embodiments of the light sensor, as described above, use multiple detection elements to detect direction of an incident light beam. Embodiments of the light sensor also use simpler signal processing than multi-collimation systems, and fewer light sensors may be used. Additionally, angular resolution of the beam direction depends on the signal-to-noise ratio (SNR) and divergences of the beam. With the photo detectors 44 that have capability of spectral selectivity, embodiments of the directional light sensor allow spectrum recovery of the source using optical power transformation described in expression 2.

Figure 8:
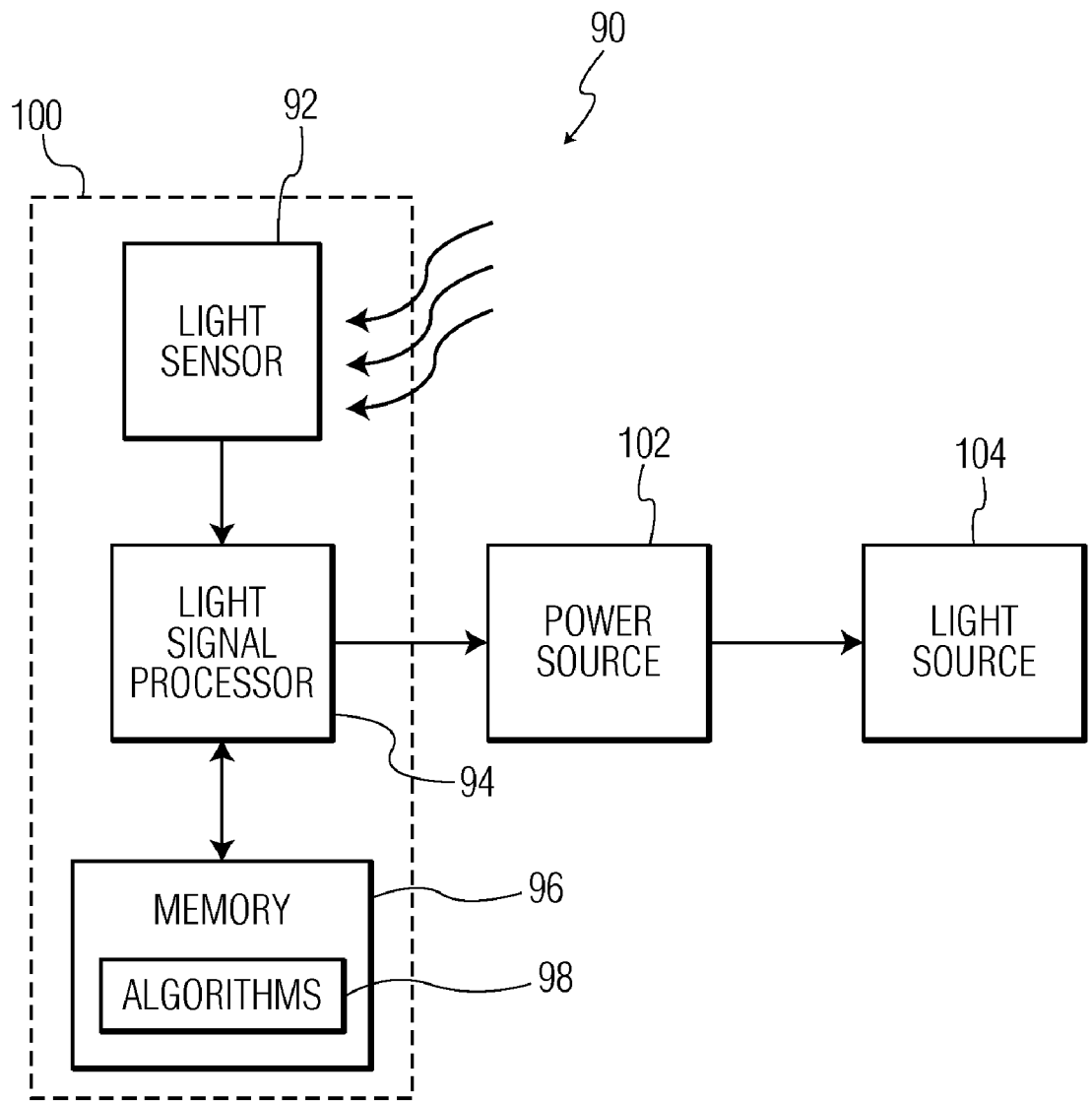
FIG. 8 illustrates a schematic block diagram of one embodiment of a light control system.

FIG. 8 illustrates a schematic block diagram of one embodiment of a light control system 90. Although the depicted light control system 90 includes several functional blocks described herein, other embodiments of the light control system 90 may include fewer or more functional blocks to implement more or less functionality.

The depicted light control system 90 includes a light sensor 92, a light signal processor 94, and a memory device 96. In one embodiment, the memory device stores one or more algorithms 98. Alternatively, the light signal processor 94 may implement hardware or a combination of hardware and software to implement functionality equivalent to the described algorithms 98. Additionally, in some embodiments, some or all of the algorithms 98 may be stored within a memory portion of the light signal processor 94 or another device coupled to the light signal processor 94. In one embodiment, the light sensor 92, the light signal processor 94, and the memory device 96 are implemented on a single chip 100. Alternatively, these components may be implemented on separate chips or a combination of chips.

In one embodiment, the light sensor 92 detects incident light. Any embodiment of the light sensors described above may be used in the light control system 90. In one embodiment, the light sensor 92 includes a dielectric layer 46, a plurality of photo detectors 44, and a plurality of stacks 48 of opaque slats 50, as described above. In some embodiments, however, the light sensor 92 may have only parallel light apertures 52, and no non-parallel apertures 52. Alternatively, the light sensor 92 may include non-parallel apertures 52. The light signal processor 94 is coupled to the light sensor 92 to receive a photo detector signal (e.g., a photocurrent) from at least one of the plurality of photo detectors 44 of the light sensor 92. The light signal processor 94 also computes an intensity of the incident light (shown by the wavy lines adjacent to the light sensor 92) based on the photo detector signal associated with the incident light detected by the corresponding photo detector 44.

For embodiments of the light sensor 92 which include orthogonal, or otherwise non-parallel, light apertures 52, the light signal processor 94 also computes an azimuth angle for the incident light signal based on photo detector signals from two or more of the plurality of photo detectors 44. Additionally, the light signal processor 94 computes an angle of incidence for the incident light signal based on photo detector signals from two or more of the plurality of photo detectors 44. Furthermore, the light signal processor 94 may derive the intensity of the incident light based on the azimuth angle computation and the angle of incidence computation. In some embodiments, the computed intensity of the incident light is representative of an intensity of the incident light outside of the dielectric layer 46. Similarly, the computed angle of incidence may be representative of an angle of incidence of the incident light outside of the dielectric layer 46.

The illustrated light control system 90 also includes a power source 102 and a light source 104. The light source 104 generates a light for an electronic device such as a laptop computer, a mobile telephone, a personal digital assistant (PDA), a heads-up display, or another type of device. The power source 102 is coupled between the light signal processor 94 and the light source 104 to adjust an output characteristic of the light source 104 in response to a computation for the incident light by the light signal processor 94. For example, the output of the light source 104 may be increased if the light signal processor 94 determines, via the light sensor 92, that the ambient illumination is above a threshold. Alternatively, the output of the light source 104 may be decreased if the light signal processor 94 determines, via the light sensor 92, that the ambient illumination is below a threshold. In other embodiments, the light signal processor 94 may interface with the light source 104 in another manner to alter the characteristics of the light source 104 in response to a signal from the light sensor 92. For example, the light signal processor 94 may mechanically control a position or orientation of the light source 104. Other embodiments may facilitate other types of control of the lights source 104.

Figure 9:
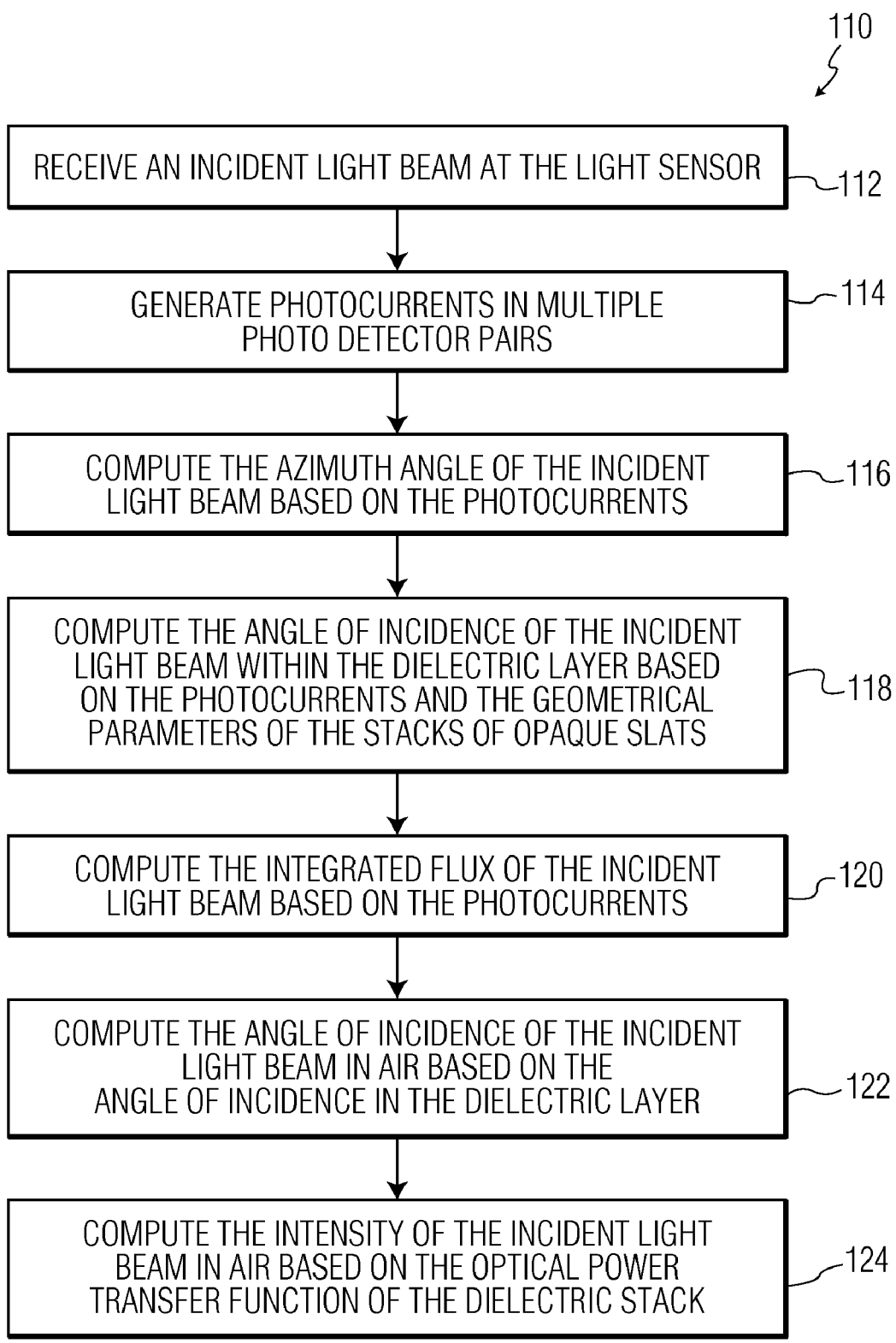
FIG. 9 illustrates a schematic flow chart diagram of one embodiment of a method of operation for the light control system of FIG. 8.

FIG. 9 illustrates a schematic flow chart diagram of one embodiment of a method 110 of operation for the light control system 90 of FIG. 8. Although the operation method 110 of FIG. 9 is described in relation to the light control system 90 of FIG. 8, other embodiments may be implemented in conjunction with other light control systems.

At block 112, the optical detector receives an incident light beam at the light sensor 92. As a result, the photo detectors 44 generate photocurrents based on the amount of light that reaches the photo detectors 44, as described above. At block 116, the light signal processor 94 computes the azimuth angle of the incident light beam based on the photocurrents, for example, using the equations described above. At block 118, the light signal processor 94 also computes the angle of incidence of the incident light beam within the dielectric layer 46 of the light sensor 92. In one embodiment, the light signal processor 94 computes the angle of incidence based on the photocurrents and the geometrical parameters of the stacks 48 of opaque slats 50.

At block 120, the light signal processor 94 also computes the integrated flux of the incident light beam based on the photocurrents. At block 122, the light signal processor 94 also computes the angle of incidence of the incident light beam in air. As described above, the angle of incidence of the incident light beam in air is computed based on the angle of incidence of the light beam in the dielectric material 46 using Snell's law. At block 124, the light signal processor 94 also computes the intensity of the incident light beam in air based on the optical power transfer function of the dielectric material 46. The depicted method 110 then ends. However, other embodiments of the method may implement further operations to adjust a characteristic of the light source 104 based on one or more of the computed values described above.

Figure 10:
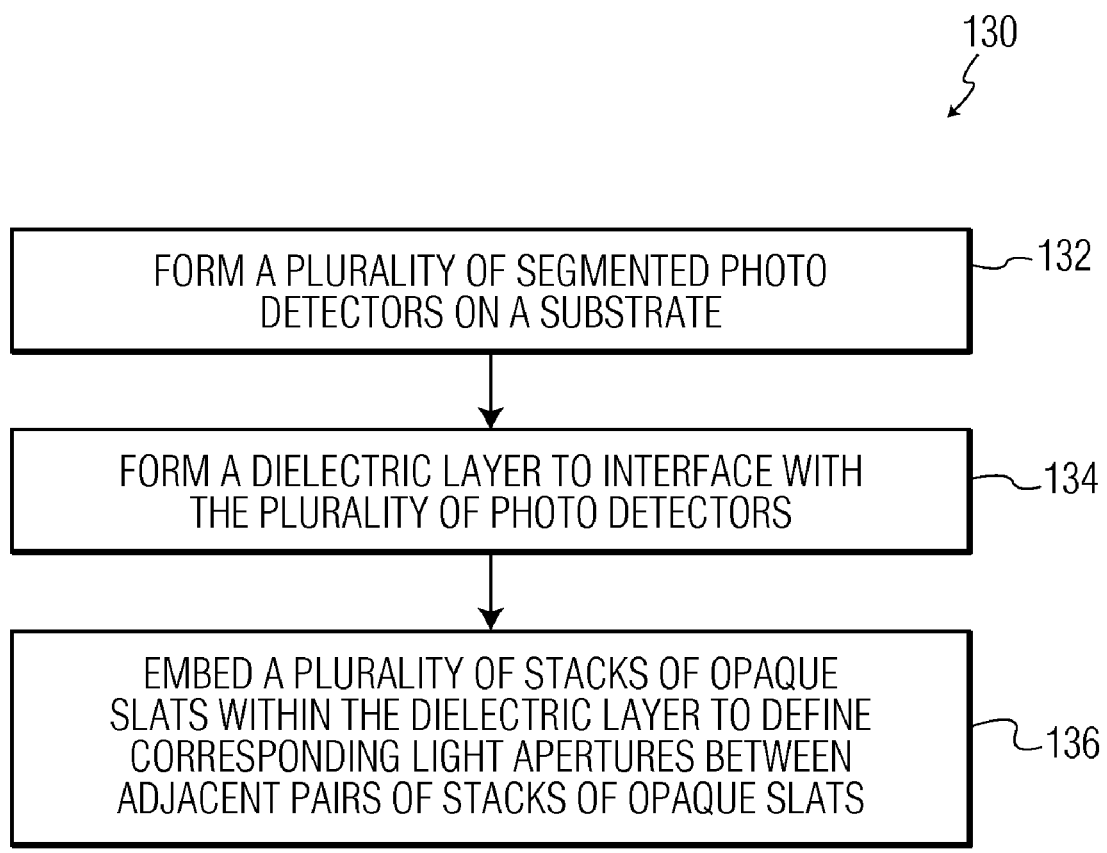
FIG. 10 illustrates a schematic flow chart diagram of one embodiment of a method for making a light sensor.

FIG. 10 illustrates a schematic flow chart diagram of one embodiment of a method 130 for making a light sensor 92. Although the method 130 of FIG. 10 is described in relation to the light sensor 92 of FIG. 8, other embodiments may be implemented in conjunction with other light sensors.

At block 132, a plurality of segmented photo detectors 44 are formed on a substrate 42. Then, at block 134 a dielectric layer 46 is formed to interface with the plurality of photo detectors 44. At block 136, a plurality of stacks 48 of opaque slats 50 are embedded within the dielectric layer 46. As described above, the stacks 48 (also stacks 56) define corresponding light apertures 52 (also light apertures 58) between adjacent pairs of stacks of opaque slats 50. In some embodiments, the opaque slats 50 are formed in conjunction with the various layers of a dielectric stack. The depicted method 130 then ends.

In another embodiment, the method 130 also includes arranging the plurality of stacks 48 of opaque slats 50 so that at least some of the stacks 48 of opaque slats 50 are oriented in parallel to other stacks 48 of opaque slats 50, with further stacks 48 of opaque slats 50 oriented at a non-zero angle relative to the parallel stacks 48 of opaque slats 50. Also, each of the stacks 48 of opaque slats 50 may include a plurality of opaque slats 50 in a tapered stack 48 which tapers away from the plurality of photo detectors 44 along a substantially perpendicular direction relative to a surface of the plurality of photo detectors 44. Additionally, each of the opaque slats 50 within each stack 48 may have a different width from the other opaque slats 50 within the same stack 48, and the opaque slats 50 of each stack 48 are arranged to form an asymmetrically tapered stack.

In another embodiment, the method 130 also includes combining the light sensor 92 and associated signal processing circuitry (e.g., the light signal processor 94) on a single chip 100. The light signal processor 94 may include circuitry to implement algorithms to compute an angle of inclination of an incident light beam, compute an azimuth angle of the incident light beam, and compute an intensity measurement of the incident light beam. Additionally, the light signal processor 94 may include circuitry to implement algorithms to compute an integrated flux of the incident light beam, as well as a beam spectrum of the incident light beam based on direction reconstruction of the incident light beam and a transfer function of the computed intensity of the incident light beam. Other embodiments of the light signal processor 94 may include additional circuitry to implement additional functionality.

While various embodiments discussed above are described in relation to controlling, for example, the brightness of a display monitor, other embodiments may be implemented to facilitate control over other aspects of a system. As another example, some embodiments may be implemented in conjunction with the operation of light guided equipment.

Although specific embodiments of the invention have been described and illustrated, the invention is not to be limited to the specific forms or arrangements of parts as described and illustrated herein. The invention is limited only by the claims.

What is claimed is:

1. A light sensor for detecting an intensity of incident light and an angle of incidence of the incident light, the light sensor comprising:
    a dielectric layer, wherein the dielectric layer is substantially transparent to the incident light;
    a plurality of photo detectors coupled relative to the dielectric layer, the photo detectors configured to detect the incident light through the dielectric layer; and
    a plurality of stacks of opaque slats embedded within the dielectric layer approximately parallel to an interface between the dielectric layer and the photo detectors, the plurality of stacks of opaque slats configured to define tapered light apertures between adjacent stacks of opaque slats; wherein the said apertures are tapered monotonically and along a direction perpendicular to the light sensitive surface.

2. The light sensor of claim 1, wherein the plurality of stacks of opaque slats further comprises:
    a first pair of stacks of opaque slats which are substantially parallel to each other; and
    a second pair of stacks of opaque slats which are substantially parallel to each other and which are substantially orthogonal to the first pair of stacks of opaque slats.

3. The light sensor of claim 1, wherein the opaque slats within at least one of the stacks of opaque slats have different widths and are arranged to form a tapered stack, wherein a cross-section of the tapered stack defines an asymmetrical taper.

4. The light sensor of claim 1, wherein the plurality of photo detectors comprise segmented photo detectors, and the light apertures defined by the stacks of opaque slats are aligned with the segmented photo detectors.

5. The light sensor of claim 4, wherein the segmented photo detectors comprise spectrometer photo detectors.

6. The light source of claim 1, wherein the opaque slats comprise metal slats or polysilicon slats.

7. The light source of claim 1, wherein at least one stack of opaque slats is configured to shadow incident light at an angle of incidence from reaching a photo detector adjacent to the corresponding stack of opaque slats.

8. A light sensing system, comprising:
    a light sensor to detect incident light, the light sensor comprising:
        a dielectric layer, wherein the dielectric layer is substantially transparent to the incident light;
        a plurality of photo detectors coupled relative to the dielectric layer, the photo detectors configured to detect the incident light through the dielectric layer; and
        a plurality of stacks of opaque slats embedded within the dielectric layer approximately parallel to an interface between the dielectric layer and the photo detectors, the plurality of stacks of opaque slats configured to define tapered light apertures between adjacent stacks of opaque slats; and
    a light signal processor coupled to the light sensor, the light signal processor configured to receive a photo detector signal from at least one of the plurality of photo detectors and to compute an intensity of the incident light based on the photo detector signal associated with the incident light detected by the corresponding photo detector; wherein the said apertures are tapered monotonically and along a direction perpendicular to the light sensitive surface.

9. The light sensing system of claim 8, wherein at least some of the stacks of opaque slats are arranged orthogonally to other stacks of the opaque slats.

10. The light sensing system of claim 9, wherein the light signal processor is further configured to compute an azimuth angle for the incident light signal based on photo detector signals from two or more of the plurality of photo detectors.

11. The light sensing system of claim 10, wherein the light signal processor is further configured to compute an angle of incidence for the incident light signal based on photo detector signals from two or more of the plurality of photo detectors.

12. The light sensing system of claim 11, wherein the light signal processor is further configured to derive the intensity of the incident light based on the azimuth angle computation and the angle of incidence computation.

13. The light sensing system of claim 11, wherein the computed intensity of the incident light is representative of an intensity of the incident light outside of the dielectric layer, and the computed angle of incidence is representative of an angle of incidence of the incident light outside of the dielectric layer.

14. The light sensing system of claim 8, further comprising:
    a light source configured to generate a light for an electronic device; and
    a power source coupled between the light signal processor and the light source, the power source configured to adjust an output characteristic of the light source in response to a computation for the incident light by the light signal processor.

15. The light sensing system of claim 8, further comprising a memory device coupled to the light signal processor, the memory device configured to store an algorithm for a computation by the light signal processor for the incident light.

16. The light sensing system of claim 8, wherein electronics for the light sensor are implemented on a chip and electronics for the light signal processor are implemented on the same chip.

17. A method of making a light sensor, the method comprising:
    forming a plurality of segmented photo detectors on a substrate;
    forming a dielectric layer to interface with the plurality of segmented photo detectors; and
    embedding a plurality of stacks of opaque slats within the dielectric layer to define corresponding tapered light apertures between adjacent pairs of stacks of opaque slats; wherein the said apertures are tapered monotonically and along a direction perpendicular to the light sensitive surface.

18. The method of claim 17, further comprising:
    arranging the plurality of stacks of opaque slats so that at least some of the stacks of opaque slats are oriented in parallel to other stacks of opaque slats, and further stacks of opaque slats are oriented at a non-zero angle relative to the parallel stacks of opaque slats, wherein each of the stacks of opaque slats comprises a plurality of opaque slats in a tapered stack which tapers away from the plurality of photo detectors along a substantially perpendicular direction relative to a surface of the plurality of photo detectors, each of the opaque slats within each stack has a different width from the other opaque slats within the same stack and the opaque slats of each stack are arranged to form an asymmetrically tapered stack.

19. The method of claim 17, further comprising:
combining the light sensor and associated signal processing circuitry on a single chip, wherein the associated signal processing circuit comprises:
circuitry to implement an algorithm to compute an angle of inclination of an incident light beam;
circuitry to implement an algorithm to compute an azimuth angle of the incident light beam; and
circuitry to implement an algorithm to compute an intensity measurement of the incident light beam.

20. The method of claim 19, wherein the associated signal processing circuitry further comprises:
circuitry to implement an algorithm to compute an integrated flux of the incident light beam; and
circuitry to implement an algorithm to compute a beam spectrum of the incident light beam based on direction reconstruction of the incident light beam and a transfer function of the computed intensity of the incident light beam.

* * * * *